(12) United States Patent
Hack et al.

(10) Patent No.: US 10,490,774 B2
(45) Date of Patent: Nov. 26, 2019

(54) FLEXIBLE AMOLED DISPLAY

(71) Applicant: Universal Display Corporation, Ewing, NJ (US)

(72) Inventors: Michael Hack, Ewing, NJ (US); Ruiqing Ma, Ewing, NJ (US); Julia J. Brown, Ewing, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 15/918,265

(22) Filed: Mar. 12, 2018

(65) Prior Publication Data

US 2018/0205036 A1 Jul. 19, 2018

Related U.S. Application Data (63) Continuation of application No. 15/177,520, filed on Jun. 9, 2016, now Pat. No. 9,947,895.

(Continued)

(51) Int. Cl.
| | | |
|---|---|---|
| *H01L 29/08* | (2006.01) | |
| *H01L 51/52* | (2006.01) | |
| *H01L 27/32* | (2006.01) | |

(52) U.S. Cl.
CPC ...... *H01L 51/5253* (2013.01); *H01L 27/3279* (2013.01); *H01L 27/3258* (2013.01);
(Continued)

(58) Field of Classification Search
CPC . H01L 51/52; H01L 51/5253; H01L 27/3279; H01L 27/3258; H01L 27/3274
See application file for complete search history.

(56) References Cited

U.S. PATENT DOCUMENTS

| 4,769,292 A | 9/1988 | Tang et al. |
|---|---|---|
| 5,247,190 A | 9/1993 | Friend et al. |

(Continued)

FOREIGN PATENT DOCUMENTS

| EP | 1238981 | 9/2002 |
|---|---|---|
| JP | 2010135467 | 6/2010 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Phuc T Dang
(74) *Attorney, Agent, or Firm* — Riverside Law LLP (57) ABSTRACT

A flexible AMOLED display is disclosed including an OLED stack having an anode layer, a cathode layer and an organic light emitting layer between the anode layer and the cathode layer. A backplane includes a substrate, a plurality of bus lines, and a thin film transistor array. A permeation barrier layer is positioned between the OLED stack and the backplane, and a plurality of vias connect the OLED anode layer to the backplane thin film transistor array. In one embodiment, a neutral plane of the AMOLED display crosses the permeation barrier. In one embodiment, the thickness of at least a portion of the bus lines is greater than the thickness of the cathode layer. A method of increasing the flexibility of an AMOLED display is disclosed. A method of assembling a flexible AMOLED display under a processing temperature of less than 200 degrees Celsius is also disclosed.

6 Claims, 4 Drawing Sheets

Related U.S. Application Data (60) Provisional application No. 62/180,881, filed on Jun. 17, 2015.

(52) U.S. Cl.
CPC .. *H01L 27/3274* (2013.01); *H01L 2251/5338* (2013.01); *H01L 2251/55* (2013.01)

(56) References Cited

U.S. PATENT DOCUMENTS

| | | | |
|---|---|---|---|
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 7,279,704 B2 | 10/2007 | Walters et al. | |
| 7,431,968 B1 | 10/2008 | Shtein et al. | |
| 7,968,146 B2 | 6/2011 | Wanger et al. | |
| 8,653,512 B2 | 2/2014 | Auman et al. | |
| 8,669,325 B1* | 3/2014 | Hyman | B41M 1/30 257/40 |
| 9,608,123 B2 | 3/2017 | Egi et al. | |
| 10,134,781 B2* | 11/2018 | Yamazaki | H01L 27/1225 |
| 2003/0230980 A1 | 12/2003 | Forrest et al. | |
| 2004/0033641 A1 | 2/2004 | Yang et al. | |
| 2004/0155245 A1 | 8/2004 | Okumura | |
| 2004/0174116 A1 | 9/2004 | Lu et al. | |
| 2004/0178722 A1* | 9/2004 | Cok | H01L 51/5206 313/506 |
| 2013/0026452 A1 | 1/2013 | Kottas et al. | |
| 2013/0119354 A1 | 5/2013 | Ma et al. | |
| 2013/0194651 A1* | 8/2013 | Srivastava | G02F 1/01 359/279 |
| 2013/0306971 A1* | 11/2013 | Bedell | H01L 21/84 257/59 |
| 2014/0159043 A1* | 6/2014 | Sakariya | H01L 27/124 257/59 |
| 2015/0001508 A1 | 1/2015 | Lee et al. | |
| 2015/0042855 A1* | 2/2015 | Baek | H04N 5/3535 348/294 |
| 2015/0144909 A1* | 5/2015 | Byun | H01L 51/5253 257/40 |
| 2015/0207098 A1 | 7/2015 | Yasuda | |
| 2015/0287682 A1* | 10/2015 | Ahn | H01L 21/76835 257/773 |
| 2016/0072066 A1* | 3/2016 | Lee | H01L 51/0013 438/35 |

FOREIGN PATENT DOCUMENTS

| | | |
|---|---|---|
| WO | 2004111066 | 12/2004 |
| WO | 2008044723 | 4/2008 |
| WO | 2008057394 | 5/2008 |
| WO | 2010011390 | 1/2010 |
| WO | 2010111175 | 9/2010 |

OTHER PUBLICATIONS

Baldo et al., "Very high-efficiency green organic light-emitting devices based on electrophosphorescence," Appl. Phys. Lett., vol. 75, No. 1, 4-6 (1999).

Juejun Hu et al., "Flexible integrated photonics: where materials, mechanics and optics meet [Invited]," 2013, Opt. Mater. Express 3, 1313-1331.

* cited by examiner

FLEXIBLE AMOLED DISPLAY

CROSS-REFERENCE TO RELATED APPLICATIONS

This application is a divisional of U.S. patent application Ser. No. 15/177,520, filed Jun. 9, 2016, which is a non-provisional of U.S. Patent Application Ser. No. 62/180,881, filed Jun. 17, 2015, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to flexible displays and devices such as organic light emitting diodes and other devices, including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher"

HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

There is a desire to create displays with increased flexibility, and even rollable displays. For an AMOLED display to be rollable, all of its key components must be rollable. The components that are least amenable to being bent and flexed to very tight radius of curvature are those that are composed of stiff, inorganic materials. However, backplane components are typically composed of stiffer materials. For example, within a typical AMOLED backplane, the transistors are often composed of stiff materials. To improve flexibility, the transistors are constructed to be small in size and isolated from each other in "islands" as this improves flexibility of the transistor array within the backplane. In further consideration, it is known that tensile stress is generally more damaging to device architecture than compressive stress, as it causes films to delaminate and crack, while compressive stress causes films to buckle. OLEDs tend to be flexible, given they are a stack of organic materials sandwiched between two electrodes. However, this architecture still does not achieve the level of flexibility desired, as the overall device layers are still subject to tensile stresses. The main limitations to flexibility will be low resistance metal bus lines required to pass data and scan signals from the display periphery to the backplane circuits in the interior pixels, as well as to provide power to the OLED devices themselves.

As bending radii for flexible and foldable displays become smaller and smaller, the stresses and strains become larger. For rollable displays, there are many factors that must be taken into consideration to avoid films delaminating or cracking. OLEDs in particular have been shown to withstand bending to radius of curvature around 1 mm, and organic and oxide TFTs have shown themselves to also be very flexible when patterned into small islands. Design approaches that advantageously utilize the neutral plane for minimizing strain have been previously proposed. For example, positioning thin film photonic devices at the neutral plane inside a multi-layer stack has been suggested for minimizing strain during bending. See Juejun Hu et al., "Flexible integrated photonics: where materials, mechanics and optics meet [Invited]," Opt. Mater. Express 3, 1313-1331 (2013).

To further improve flexibility, backplane components are also being constructed of organic materials. To avoid outgassing from the backplane from "poisoning" the organic materials in the OLED, it is desirable to place a permeation barrier in between the backplane and OLED in an AMOLED display. This permeation barrier could also serve as a planarization layer, but would probably be a separate layer placed over a planarization layer, which typically would be an organic material. As this permeation barrier would be continuous, it would be very susceptible to cracking and delamination under high tensile stress.

Thus, what is needed in the art is an improved flexible display that reduces the strain in a permeation barrier placed in an AMOLED display and improves the permeation barrier's ability to be repetitively flexed.

SUMMARY OF THE INVENTION

According to an embodiment, a flexible AMOLED display includes an OLED stack having an anode layer, a cathode layer and an organic light emitting layer between the anode layer and the cathode layer; a backplane having a substrate, a plurality of bus lines, and a thin film transistor array; a permeation barrier layer between the OLED stack and the backplane; and multiple vias connecting the OLED anode layer to the backplane thin film transistor array. In one embodiment, a neutral plane of the AMOLED display crosses the permeation barrier. In one embodiment, the neutral plane of the AMOLED display crosses the permeation barrier layer multiple times. In one embodiment, the thickness of at least a portion of the bus lines is greater than the thickness of the cathode layer. In one embodiment, the flexible display includes a planarization layer between the permeation barrier layer and the backplane. In one embodiment, the flexible display includes a passivation layer between the permeation barrier layer and the backplane. In one embodiment, the thin film transistor array includes an organic active layer. In one embodiment, the thin film transistor array includes an organic gate insulator. In one embodiment, the flexible display includes a thin film barrier disposed over the OLED stack. In one embodiment, when the AMOLED display is in a flexed state, a first portion of the permeation barrier layer is in compressive stress and a second portion of the permeation barrier layer is in tensile stress. In one embodiment, the OLED stack cathode layer is a continuous plane of conductive material. In one embodiment, the OLED stack cathode layer has a substantially uniform thickness. In one embodiment, the OLED stack cathode layer includes a transparent material. In one embodiment, the permeation barrier layer includes a transparent material. In one embodiment, the backplane substrate has a glass transition temperature of less than 200 degrees Celsius. In one embodiment, the permeation barrier layer has a glass transition temperature of less than 200 degrees Celsius. In one embodiment, the permeation barrier layer comprises a thin inorganic film. In one embodiment, the permeation barrier layer includes a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. In one embodiment, a product including the flexible display is selected from the group consisting of: a flat panel display, a computer monitor, a medical monitor, a television, a touchscreen, a retractable projector screen, a billboard, a general illumination device, a signal, a heads up display, a virtual reality display, an augmented reality display, a fully transparent display, a large area wall, a theater, a stadium screen, and a sign.

In one embodiment, a flexible display includes an OLED having an anode layer, a cathode layer and an organic light emitting layer between the anode layer and the cathode layer; a backplane circuit including a plurality of bus lines and a thin film transistor array; and a permeation barrier layer between the OLED stack and the backplane circuit;

where a plurality of vias through the permeation barrier connect the OLED anode layer to the backplane circuit; and where the thickness of at least a portion of the bus lines is greater than the thickness of the cathode layer. In one embodiment, a neutral plane of the AMOLED display crosses the permeation barrier layer at least once. In one embodiment, the flexible display includes a planarization layer between the permeation barrier layer and the backplane circuit. In one embodiment, the flexible display includes a passivation layer between the permeation barrier layer and the backplane circuit. In one embodiment, the thin film transistor array comprises an organic active layer. In one embodiment, the thin film transistor array comprises an organic gate insulator. In one embodiment, the flexible display includes a thin film barrier disposed over the OLED. In one embodiment, when the display is in a flexed state, a first portion of the permeation barrier layer is in compressive stress and a second portion of the permeation barrier layer is in tensile stress. In one embodiment, the OLED cathode layer is a continuous plane of conductive material. In one embodiment, the OLED cathode layer has a substantially uniform thickness. In one embodiment, the OLED cathode layer includes a transparent material. In one embodiment, the permeation barrier layer includes a transparent material. In one embodiment, the backplane circuit includes a substrate with a glass transition temperature of less than 200 degrees Celsius. In one embodiment, the permeation barrier layer has a glass transition temperature of less than 200 degrees Celsius. In one embodiment, the permeation barrier layer includes a thin inorganic film. In one embodiment, a product including the flexible display is selected from the group consisting of: a flat panel display, a computer monitor, a medical monitor, a television, a touchscreen, a retractable projector screen, a billboard, a general illumination device, a signal, a heads up display, a fully transparent display, a large area wall, a theater, a stadium screen, and a sign.

In one embodiment, a method of increasing the flexibility of an AMOLED display having an OLED, a backplane circuit and a permeation barrier layer between the OLED and backplane circuit, includes the steps of maintaining a substantially uniform thickness in a cathode layer of the OLED and varying the thickness of bus lines in the backplane circuit, such that a neutral plane of the AMOLED display crosses the permeation barrier player at least once.

In one embodiment, a method of assembling a flexible AMOLED display includes the steps of forming a backplane circuit including a plurality of bus lines and a thin film transistor array onto a flexible substrate; depositing a permeation barrier layer over the backplane circuit; etching a plurality of vias into the permeation barrier layer; and disposing an OLED having an anode layer, an OLED stack and an OLED cathode layer over the permeation barrier layer; where the processing temperature when assembling the flexible AMOLED display is less than 200 degrees Celsius. In one embodiment, the method includes the step of planarizing the backplane. In one embodiment, the method includes the step of passivating the backplane. In one embodiment, the method includes the step of disposing a thin film barrier over the OLED. In one embodiment, the method includes the step of disposing a plastic film over the flexible AMOLED display. In one embodiment, the method includes the step of positioning at least a portion of the permeation barrier layer on both sides of a neutral plane of the assembled AMOLED display.

DETAILED DESCRIPTION

It is to be understood that the figures and descriptions of the present invention have been simplified to illustrate elements that are relevant for a more clear comprehension of the present invention, while eliminating, for the purpose of clarity, many other elements found in flexible displays. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, the preferred methods and materials are described.

As used herein, each of the following terms has the meaning associated with it in this section.

The articles "a" and "an" are used herein to refer to one or to more than one (i.e., to at least one) of the grammatical object of the article. By way of example, "an element" means one element or more than one element.

"About" as used herein when referring to a measurable value such as an amount, a temporal duration, and the like, is meant to encompass variations of ±20%, ±10%, ±5%, ±1%, and ±0.1% from the specified value, as such variations are appropriate.

Ranges: throughout this disclosure, various aspects of the invention can be presented in a range format. It should be understood that the description in range format is merely for convenience and brevity and should not be construed as an inflexible limitation on the scope of the invention. Where appropriate, the description of a range should be considered to have specifically disclosed all the possible subranges as well as individual numerical values within that range. For example, description of a range such as from 1 to 6 should be considered to have specifically disclosed subranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
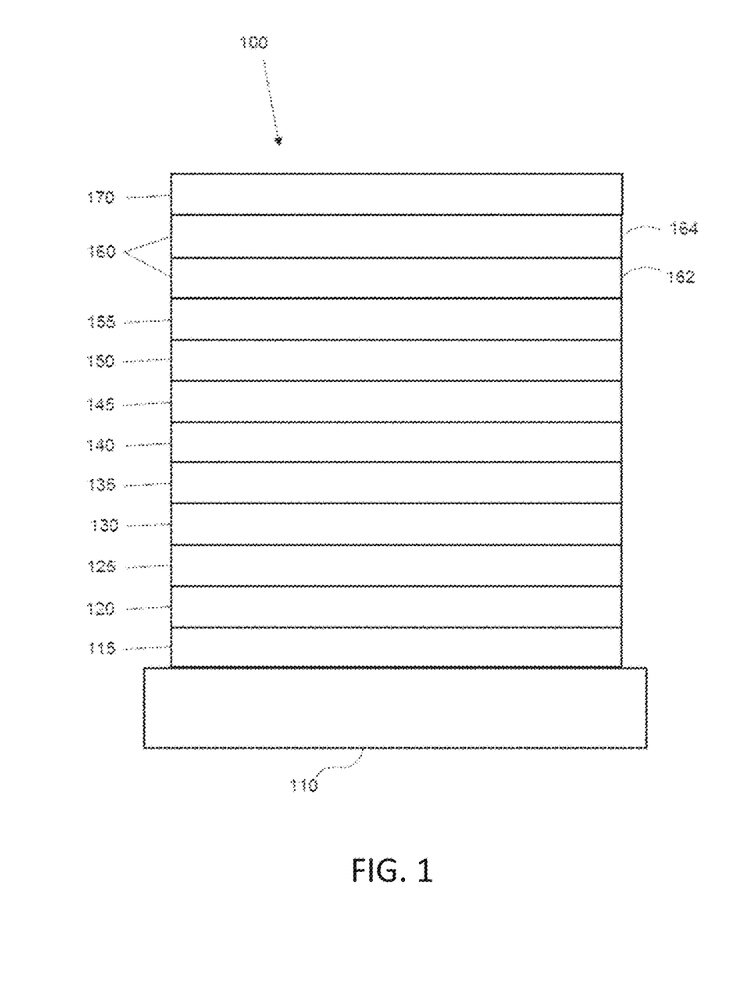
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
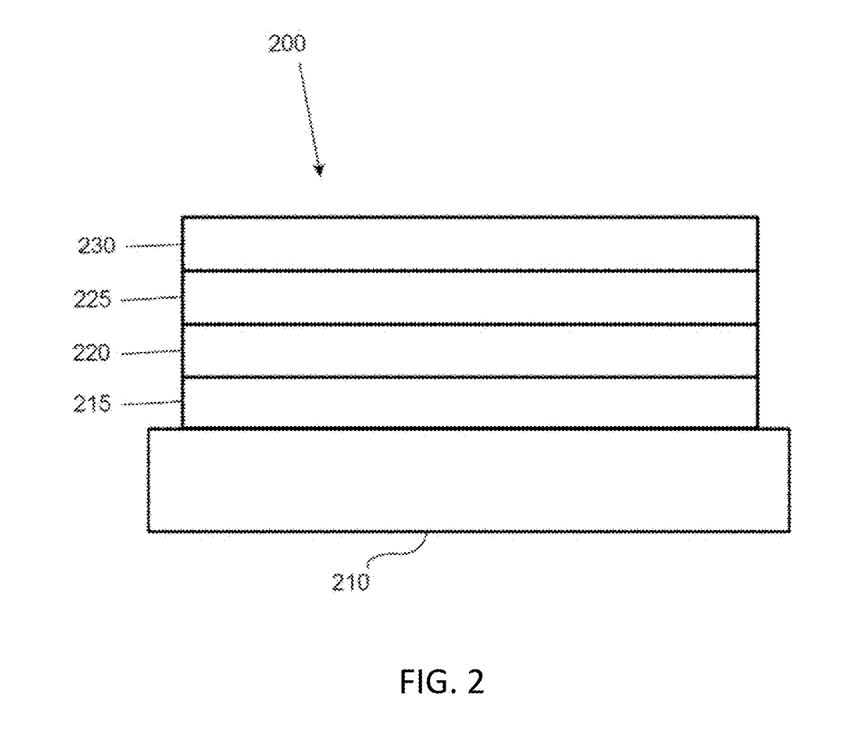
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve outcoupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques, sputtering or vacuum thermal evaporation, and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, virtual reality displays, augmented reality displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Active matrix backplanes may consist of circuits containing thin film transistors, whose active layer may be either an organic or inorganic semiconductor. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

Figure 3:
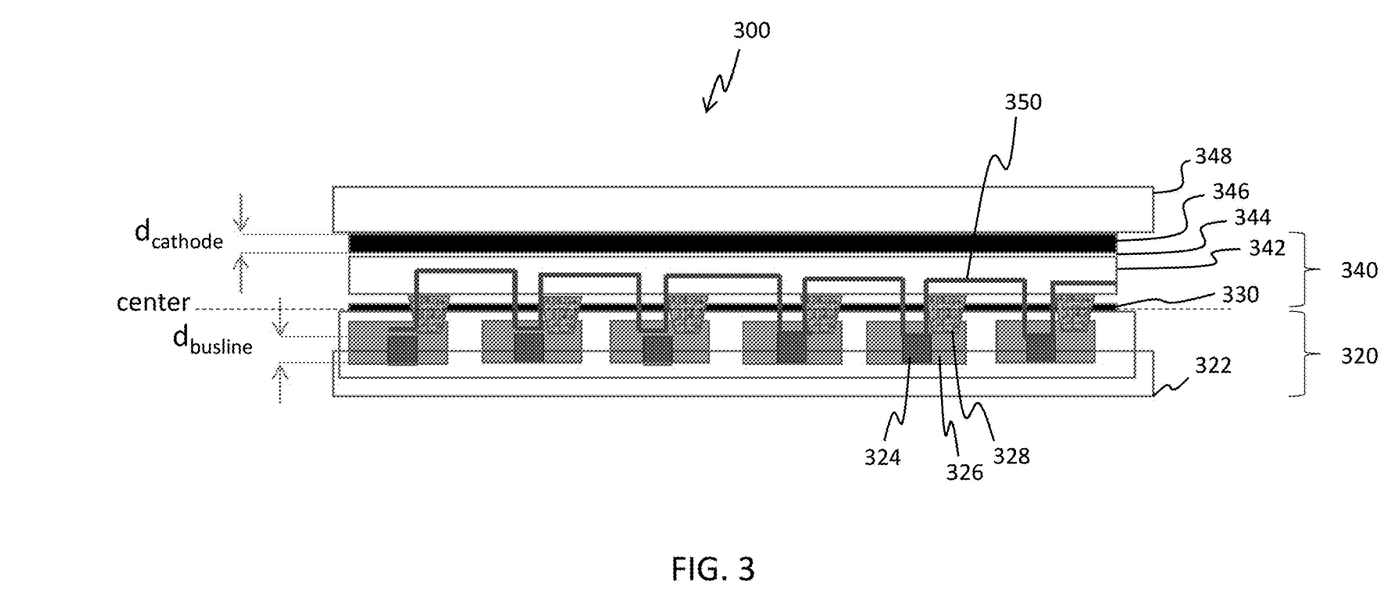
FIG. 3 shows a schematic of a flexible display according to one embodiment.

With reference now to FIG. 3, a flexible and rollable AMOLED display 300 according to one embodiment includes a backplane 320 having multiple bus lines 324 that carry power to the OLED 340 in the front plane. The OLED 340 includes an anode 342, a cathode 346 and an organic light emitting layer 344 therebetween. It should be appreciated that the frontplane OLED architecture may include any number of organic layers or stacks, as desired. In this example, the OLED power lines/bus lines 324 require the lowest resistance, and therefore are the thickest conductors. The OLED power is carried by the bus line 324 in the backplane 320 that connects to the drain/source of a thin film transistor (TFT) 326. The other source/drain terminal of the TFT 326 will contact the OLED anode 342 by way of a via 328 connecting the TFT backplane 320 to the OLED stack 340. The OLED power will also flow from its cathode 346, and in general, this is an unpatterned low resistance layer, which can be solid metal for a bottom emission device, or transparent for a top emission device. A top protective or sealing layer 348 such as a thin plastic film may also be included. Since the backplane TFT may be composed of organic materials, either because of its active materials (e.g. organic TFTs using organic active layer or gate insulator), or because of the use of organic planarization or passivation layers used to prepare the TFT for OLED deposition, a permeation barrier 330 may be incorporated into the display 300 to prevent organic films from the backplane 320 outgassing and reducing the lifetime of the OLED 340.

When a thin display is flexed, there is a theoretical neutral plane that runs through the display which defines a plane which does not expand or contract on flexing. Regions on one side of the neutral plane will be in tensile stress and regions on the other side will be in compressive stress. The closer a material is to the neutral plane, the less stress is imposed on the material during flexion. Thus, to minimize delamination or cracking of materials, it is desirable to design a thin display such that stiff or inorganic materials are as close to the neutral plane as possible.

The calculation of the neutral plane is related to the thickness, position and Young's modulus of the individual layers or films making up the display. The neutral plane will be in the middle of a symmetrical structure, and can be moved away from this position by materials having a large Young's modulus multiplied by their thickness, particularly if these films are placed away from the middle of the device. Within the OLED stack it will be the current carrying electrodes for the OLED that will have the largest Young's modulus, and so the position and thickness of these electrodes will in part determine where the neutral plane theoretically resides within the device.

With reference now specifically to FIG. 3, the cathode 346 is generally a continuous plane of conductive material, and this will tend to move the display neutral plane 350 towards the upper display surface, and away from the permeation barrier 330. Bus lines 324 in the backplane 320 near the TFT 326 will tend to pull the neutral plane 350 down towards the substrate 322. If the bus lines 324 in the backplane 320 are thicker than the cathode thickness $d_{cathode}$, and a similar distance away from the center of the display 300, then the bus lines 324 will pull the neutral plane 350 below the center of the display 300, overcoming the effect of the OLED cathode 346. By suitably selecting the relative thickness of the cathode $d_{cathode}$ and bus lines $d_{busline}$, the neutral plane 350 can cross the center of the display 300, depending on the position of the bus lines 324 in the TFT backplane 320. This ensures that when display 300 is flexed, the stress in the continuous permeation barrier 330 placed in the display 300 will include minimal amounts of both compressive and tensile stress, dependent on the pitch of the bus lines 324. Accordingly, by uniquely controlling the cathode and bus line thickness, the amount and occurrence of cracking caused by tensile stress can be reduced or eliminated. While the bus lines 324 are required to reduce voltage losses in the display, they can have a synergistic benefit to reduce any damage to an internal permeation barrier 330 under tight flexing conditions.

Accordingly, in one embodiment, a method of increasing the flexibility of an AMOLED display having an OLED, a backplane circuit and a permeation barrier layer between the OLED and backplane circuit, includes the steps of maintaining a substantially uniform thickness in a cathode layer of the OLED and varying the thickness of bus lines in the backplane circuit, such that a neutral plane of the AMOLED display crosses the permeation barrier player at least once.

Figure 4:
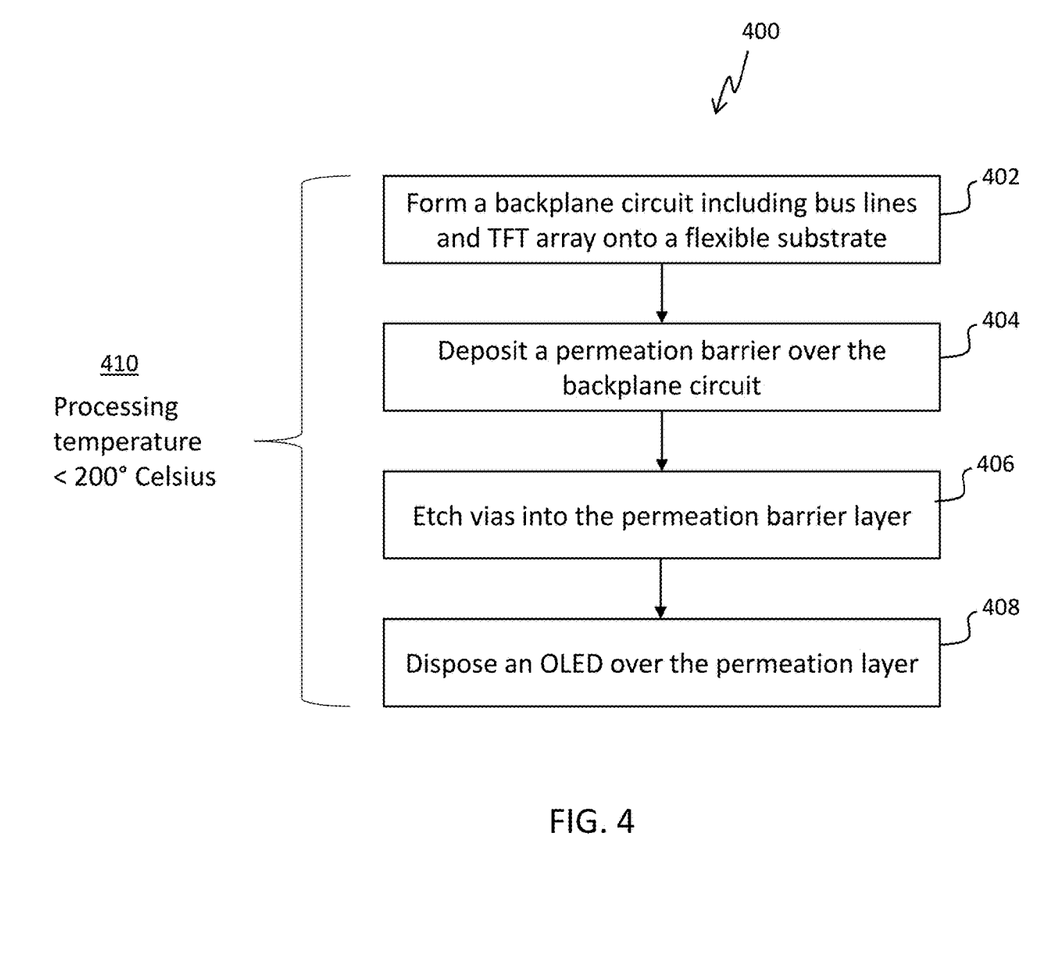
FIG. 4 is a flow chart of a method for assembling a flexible display.

With specific reference now to FIG. 4, a method of assembling a flexible AMOLED display includes the steps of forming a backplane circuit including multiple bus lines and a thin film transistor array onto a flexible substrate 402, depositing a permeation barrier layer over the backplane circuit 404, etching a plurality of vias into the permeation barrier layer 406, and disposing an OLED having an anode layer, an OLED stack and an OLED cathode layer over the permeation barrier layer 408. The processing temperature when assembling the flexible AMOLED display is less than 200 degrees Celsius 410. A flexible substrate (e.g low cost plastic such as, PET or PEN or else thin metal) is prepared, which can include an optional planarization layer), and optionally coated with a transparent and flexible permeation barrier. Bus lines are patterned on the substrate, followed by TFT deposition and fabrication using patterning techniques such as photolithography. The TFT can be planarized and passivated to provide good TFT stability and a smooth surface onto which to deposit the OLED stacks. A permeation barrier (thin inorganic film or composite barrier) would be deposited over the planarization layer, and a via etched into the device to allow for the OLED anode electrode to be deposited and connected to the backplane circuit below. The OLED stack is then deposited, followed by a cathode. A thin film barrier will then be placed over the OLED to prevent moisture and oxygen from degrading the OLED. For additional mechanical protection a plastic film and optional hardcoat is often laminated over the structure. The OLED could be bottom or top emission. It is also possible to omit the barrier layer on the bottom substrate if the internal barrier layer is sufficiently effective at preventing oxygen or moisture from degrading the OLEDs. In one embodiment, the method includes positioning at least a portion of the permeation barrier layer on both sides of a neutral plane of the assembled AMOLED display. Advantageously, low temperature processing allows the display to be manufactured using a variety of highly flexible substrate materials (e.g. plastics) and processes that have a lower processing temperature limit.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention.

We claim:

1. A method of assembling a flexible AMOLED display, comprising:
    forming a backplane circuit comprising a plurality of bus lines and a thin film transistor array onto a flexible substrate;
    depositing a flexible permeation barrier layer over the backplane circuit;
    etching a plurality of vias into the flexible permeation barrier layer; and
    disposing an OLED having an anode layer, an OLED stack and an OLED cathode layer over the flexible permeation barrier layer;
    wherein the processing temperature when assembling the flexible AMOLED display is less than 200 degrees Celsius.

2. The method of claim 1, further comprising the step of planarizing the backplane.

3. The method of claim 1, further comprising the step of passivating the backplane.

4. The method of claim 1 further comprising the step of disposing a thin film barrier over the OLED.

5. The method of claim 1 further comprising disposing a plastic film over the flexible AMOLED display.

6. The method of claim 1, further comprising positioning at least a portion of the permeation barrier layer on both sides of a neutral plane of the assembled AMOLED display.

* * * * *